United States Patent
Akao et al.

(10) Patent No.: US 11,906,367 B2
(45) Date of Patent: Feb. 20, 2024

(54) SUBSTRATE TEMPERATURE SENSOR, SUBSTRATE RETAINER AND SUBSTRATE PROCESSING APPARATUS

(71) Applicant: Kokusai Electric Corporation, Tokyo (JP)

(72) Inventors: Tokunobu Akao, Toyama (JP); Hitoshi Murata, Toyama (JP); Akinori Tanaka, Toyama (JP); Masaaki Ueno, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 530 days.

(21) Appl. No.: 17/185,408

(22) Filed: Feb. 25, 2021

(65) Prior Publication Data
US 2021/0181033 A1 Jun. 17, 2021

Related U.S. Application Data

(63) Continuation of application No. PCT/JP2019/036426, filed on Sep. 17, 2019.

(30) Foreign Application Priority Data

Sep. 18, 2018 (JP) .................................. 2018-173328

(51) Int. Cl.
*G01K 1/14* (2021.01)
*H01L 21/67* (2006.01)
(Continued)

(52) U.S. Cl.
CPC .............. *G01K 1/146* (2013.01); *G01K 1/143* (2013.01); *H01L 21/67248* (2013.01); *H01L 22/12* (2013.01)

(58) Field of Classification Search
CPC .. G01K 1/146; G01K 1/143; H01L 21/67246; H01L 22/12
See application file for complete search history.

(56) References Cited

U.S. PATENT DOCUMENTS

2009/0311807 A1* 12/2009 Yamaga ............ H01L 21/67109
257/E21.482
2012/0270169 A1* 10/2012 Yamaga ............ H01L 21/67248
374/117
(Continued)

FOREIGN PATENT DOCUMENTS

| JP | 2005-147976 A | 6/2005 |
|---|---|---|
| JP | 2014-067766 A | 4/2014 |
| JP | 2016-119412 A | 6/2016 |

OTHER PUBLICATIONS

Notice of First Examination Opinion with English translation in Chinese Application No. 201980060431.8, dated Jul. 22, 2023, 8 pages.

*Primary Examiner* — Randy W Gibson
(74) *Attorney, Agent, or Firm* — Edell, Shapiro & Finnan, LLC

(57) ABSTRACT

According to one aspect of the technique, there is provided a substrate temperature sensor configured to measure a temperature of a substrate, wherein the substrate temperature sensor is provided in a protective pipe passing through a notch provided at least in a bottom plate of a substrate retainer inserted into a process chamber in a state where the substrate is mounted on the substrate retainer.

16 Claims, 12 Drawing Sheets

(51) Int. Cl.
    *H01L 21/66* (2006.01)
    *G01K 1/143* (2021.01)

(56) References Cited

U.S. PATENT DOCUMENTS

| | | | | |
|---|---|---|---|---|
| 2014/0120636 A1* | 5/2014 | Yamaguchi | ............. | G01K 7/02 |
| | | | | 219/400 |
| 2015/0247761 A1* | 9/2015 | Miyazaki | ................. | G01K 7/02 |
| | | | | 432/32 |
| 2016/0177450 A1 | 6/2016 | Kanno | | |
| 2017/0335458 A1* | 11/2017 | Murata | ............ | H01L 21/67109 |
| 2018/0040520 A1 | 2/2018 | Yamaguchi et al. | | |

* cited by examiner

<RELATED ART>

US 11,906,367 B2

SUBSTRATE TEMPERATURE SENSOR, SUBSTRATE RETAINER AND SUBSTRATE PROCESSING APPARATUS

CROSS REFERENCE TO RELATED APPLICATIONS

This application is a continuation of International Application No. PCT/JP2019/036426, filed on Sep. 17, 2019, which claims priority under 35 U.S.C. § 119 to Application No. JP 2018-173328 filed on Sep. 18, 2018, the entire contents of which are hereby incorporated by reference.

TECHNICAL FIELD

The present disclosure relates to a substrate temperature sensor, a substrate retainer and a substrate processing apparatus.

BACKGROUND

FIG. 5 illustrates an example of routing a cable 101c by using a substrate 101 with a thermocouple attached thereto when measuring a temperature of a substrate 1. When the substrate 101 with the thermocouple is used, the cable 101c coming out of the substrate 101 with the thermocouple is routed along a support column of a substrate retainer (hereinafter, also referred to as a "boat") 31, and is pulled out of a seal cap (hereinafter, also referred to as a "CAP") 25 serving as a lid configured to close the boat 31 while supporting the boat 31. The cable 101c pulled out of the CAP 25 is further extended and wired to a temperature controller 64.

However, in such a configuration, when the boat 31 is rotated, the cable 101c may be disconnected (or broken). In such a case, it may not be possible to rotate the boat 31 and the substrate 1.

SUMMARY

Described herein is a technique capable of providing a temperature sensor in the vicinity of a substrate and measuring a temperature of a substrate which is being rotated.

According to one aspect of the technique of the present disclosure, there is provided a substrate temperature sensor configured to measure a temperature of a substrate, wherein the substrate temperature sensor is provided in a protective pipe passing through a notch provided at least in a bottom plate of a substrate retainer inserted into a process chamber in a state where the substrate is mounted on the substrate retainer.

DETAILED DESCRIPTION

Embodiments

Hereinafter, one or more embodiments (also simply referred to as "embodiments") according to the technique of the present disclosure will be described with reference to the drawings.

Figure 1:
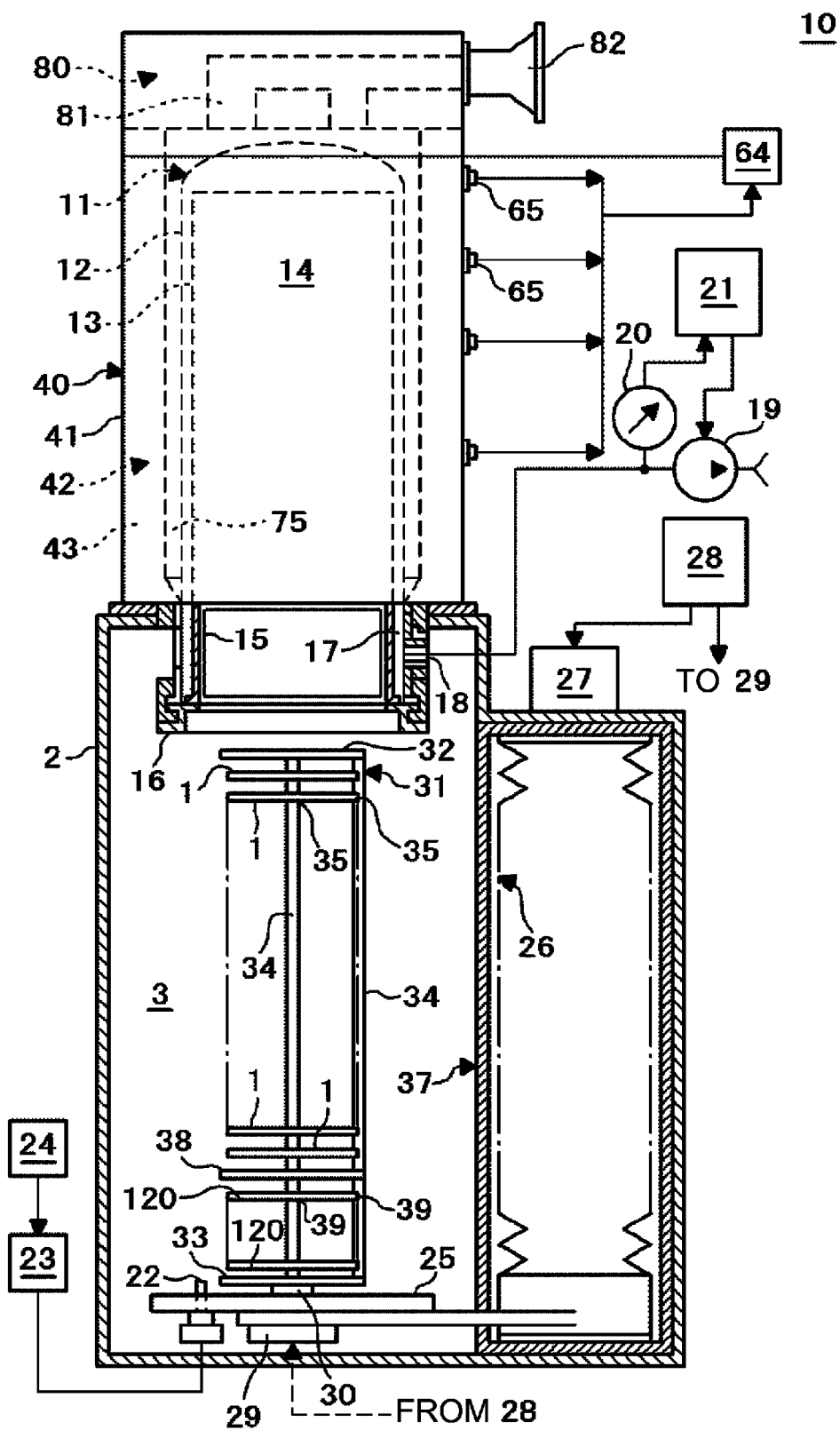
FIG. 1 schematically illustrates a vertical cross-section of a substrate processing apparatus according to one or more embodiments described herein.

A substrate processing apparatus 10 shown in FIG. 1 includes a process tube 11 serving as a reaction tube of a vertical type supported therein. The process tube 11 includes an outer tube 12 serving as an outer reaction tube and an inner tube 13 serving as an inner reaction tube. The outer tube 12 is provided concentrically with the inner tube 13. For example, the outer tube 12 is made of quartz ($SiO_2$). The outer tube 12 is of a cylinder shape with a closed upper end and an open lower end. The inner tube 13 is of a cylinder shape with open upper and lower ends. A process chamber 14 is defined by a hollow cylindrical portion of the inner tube 13. A boat 31 serving as a substrate retainer is loaded into the process chamber 14. A lower end opening of the inner tube 13 serves as a furnace opening (which is a furnace opening space) 15 for loading the boat 31 into the process chamber 14 and unloading the boat 31 out of the process chamber 14. As will be described later, the boat 31 is configured to accommodate a plurality of substrates including a substrate (hereinafter also referred to as a "wafer") 1 vertically arranged (or aligned) in a multistage manner. Therefore, an inner diameter of the inner tube 13 is greater than a maximum outer diameter of the substrate 1 to be processed. For example, the maximum outer diameter of the substrate 1 is 300 mm.

A lower end portion between the outer tube 12 and the inner tube 13 is airtightly sealed by a manifold 16 serving as a furnace opening flange. The manifold 16 is substantially of a cylinder shape. For example, for exchanging the outer tube 12 and the inner tube 13, the manifold 16 is detachably attached to each of the outer tube 12 and the inner tube 13. By supporting the manifold 16 on a housing 2 of the substrate processing apparatus 10, the process tube 11 is vertically provided on the manifold 16. Hereinafter, in the following drawings, the inner tube 13 which is a part of the process tube 11 may be omitted.

An exhaust path 17 is constituted by a gap between the outer tube 12 and the inner tube 13. The exhaust path 17 is of a circular ring shape with a constant transverse cross-section. As shown in FIG. 1, one end of an exhaust pipe 18 is connected to an upper portion of a side wall of the manifold 16, and the exhaust pipe 18 communicates with a lower end portion of the exhaust path 17. An exhauster (which is an exhaust apparatus) 19 controlled by a pressure controller 21 is connected to the other end of the exhaust pipe 18. A pressure sensor 20 is connected to an intermediate location of the exhaust pipe 18. The pressure controller 21 is configured to feedback-control the exhauster 19 based on the measured pressure by the pressure sensor 20.

A gas introduction pipe 22 is provided below the manifold 16 so as to communicate with the furnace opening 15 of the inner tube 13. A source gas supplier (which is a source gas supply apparatus), a reactive gas supply supplier (which is a reactive gas supply apparatus) and an inert gas (which is an inert gas supply apparatus), which constitute a gas supplier 23, are connected to the gas introduction pipe 22. Hereinafter, the source gas supplier, the reactive gas supplier and the inert gas supplier are collectively or individually referred to simply as the gas supplier 23. The gas supplier 23 is configured to be controlled by a gas flow rate controller 24. A gas supplied into the furnace opening 15 through the gas introduction pipe 22 flows through the process chamber 14 of the inner tube 13, and is exhausted through the exhaust path 17 and the exhaust pipe 18.

A seal cap ("CAP") 25 capable of airtightly sealing the lower end opening of the manifold 16, is provided under the manifold 16. The CAP 25 is in contact with the lower end of the manifold 16. The CAP 25 is of a disk shape, and a diameter of the CAP 25 is substantially equal to an outer diameter of the manifold 16. The CAP 25 is elevated or lowered vertically by a boat elevator 26 protected by a boat cover 37. The boat cover 37 is provided in a transfer chamber 3 of the housing 2. The boat elevator 26 may be constituted by components such as a motor-driven feed screw shaft device and a bellows. A motor 27 of the boat elevator 26 is controlled by an operation controller 28. A rotating shaft 30 is provided on a center line of the CAP 25 so as to be rotatably supported. The rotating shaft 30 is configured to be rotationally driven by a motor 29 controlled by the operation controller 28. The boat 31 is vertically supported at an upper end of the rotating shaft 30. According to the present embodiments, for example, a rotator is constituted by the rotating shaft 30 and the motor 29.

The boat 31 includes a pair of end plates (an upper end plate 32 and a lower end plate 33) and a plurality of support columns (for example, three support columns) 34 provided between the upper end plate 32 and the lower end plate 33 to connect the upper end plate 32 and the lower end plate 33. A plurality of support recesses 35 are engraved at each of the support columns 34 at equal intervals in a lengthwise direction of each of the support columns 34. The support recesses 35 located at the same stage of each of the support columns 34 are open to face one another. By inserting the plurality of the substrates including the substrate 1 into the support recesses 35 located at the same stage of each of the support columns 34, the boat 31 supports the plurality of substrates vertically arranged in a multistage manner while the plurality of substrates 1 are horizontally oriented with their centers aligned with one another. A plurality of support recesses 39 are engraved at a lower portion of each of the support columns 34 at equal intervals in the lengthwise direction of each of the support columns 34. By inserting a plurality of heat insulating plates 120 into the support recesses 39 located at the same stage of each of the support columns 34, the boat 31 supports the heat insulating plates 120 vertically arranged in a multistage manner while the heat insulating plates 120 are horizontally oriented with their centers aligned with one another.

That is, the boat 31 includes a substrate processing region between the upper end plate 32 and an end plate 38 where the plurality of substrates including the substrate 1 are accommodated, and a heat insulating plate region between the end plate 38 and the lower end plate 33 where the heat insulating plates 120 are accommodated. The heat insulating plate region is provided below the substrate processing region. For example, a heat insulator 36 is constituted by the heat insulating plates 120 provided between the end plate 38 and the lower end plate 33.

The rotating shaft 30 is configured to support the boat 31 while the boat 31 is lifted from an upper surface of the CAP 25. The heat insulator 36 is provided in the furnace opening (furnace opening space) 15 and is configured to thermally insulate the furnace opening 15. Further, the motor 29 configured to rotate the boat 31 is provided under the CAP 25. The motor 29 is configured as a hollow motor structure, and the rotating shaft 30 penetrates the motor 29.

Figure 2:
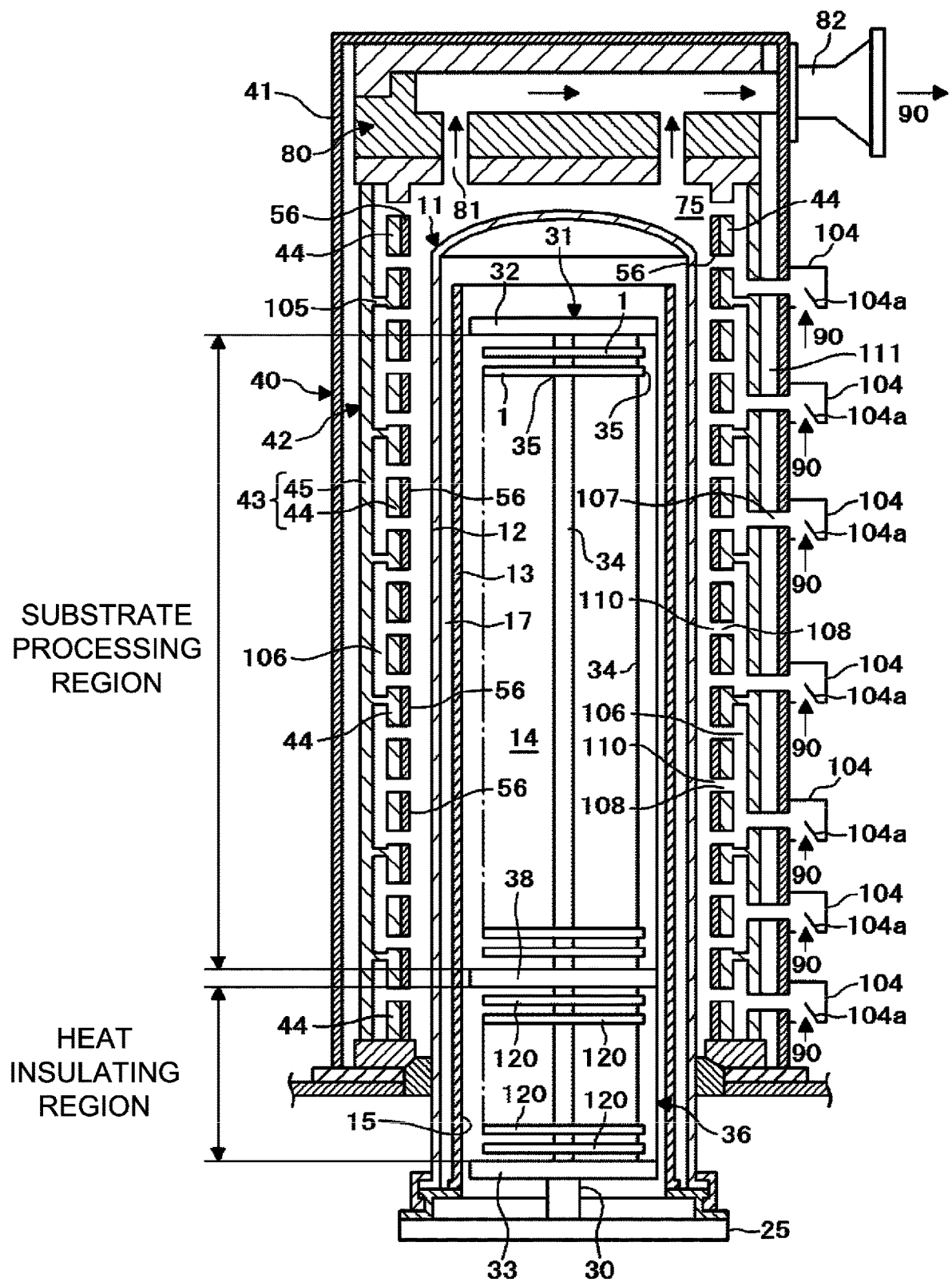
FIG. 2 schematically illustrates a vertical cross-section of a part of the substrate processing apparatus according to the embodiments described herein.

As shown in FIG. 2, a heater 40 serving as a heating structure is provided at an outside of the process tube 11. The heater 40 is provided concentrically with the process tube 11 and supported by the housing 2. The heater 40 is configured to heat the plurality of substrates including the substrate 1 in the substrate processing region supported by the boat 31. The heater 40 includes a case 41. For example, the case 41 is made of stainless steel (SUS). The case 41 is of a tube shape with a closed upper end and an open lower end. Preferably, the case 41 is of a cylinder shape. An inner diameter and an overall length of the case 41 are greater than an outer diameter and an overall length of the outer tube 12, respectively.

As shown in FIG. 2, a heat insulating structure 42 is provided in the case 41. The heat insulating structure 42 includes a sidewall outer layer (hereinafter, also simply referred to as an "outer layer") 45 provided on an outer side of the heat insulating structure 42 and a sidewall inner layer (hereinafter, also simply referred to as an "inner layer") 44 provided on an inner side of the heat insulating structure 42. The heat insulating structure 42 is of a tube shape, preferably, of a cylinder shape. A sidewall 43 of the heat insulating structure 42 of a cylinder shape is configured as a multilayer structure.

As shown in FIG. 2, a check damper 104 provided with a back-diffusion prevention structure 104a is installed in each zone of the case 41. In accordance with the check damper 104 and the back-diffusion prevention structure 104a, each zone of the case 41 is provided with a buffer 106, a gas introduction path 107, a gas supply flow path 108 and an opening hole 110, which are described later. Cooling air 90 can be supplied to the buffer 106 through the gas introduction path 107 by opening the back-diffusion prevention structure 104a.

The cooling air 90 supplied to the buffer 106 flows through the gas supply flow path 108 provided in the inner layer 44 and is supplied to a space 75 through the opening hole 110 serving as an opening. The opening hole 110 provided as a part of a supply path including the gas supply flow path 108.

As shown in FIGS. 1 and 2, a ceiling wall 80 serving as a ceiling structure is provided on an upper end of the sidewall 43 of the heat insulating structure 42. The ceiling wall 80 covers the space 75 to close the space 75. An exhaust hole 81 of a ring shape, which is a part of an exhaust path configured to exhaust an atmosphere of the space 75, is formed in the ceiling wall 80. A lower end of the exhaust hole 81, which is an upstream end of the exhaust hole 81, communicates with the inner space (that is, the space) 75. A downstream end of the exhaust hole 81 is connected to an exhaust duct 82. The cooling air 90 ejected from the opening hole 110 into the space 75 is exhausted through the exhaust hole 81 and the exhaust duct 82. In FIG. 2, a gas supply system such as the gas supplier 23 and an exhaust system such as the exhauster 19 are omitted.

Figure 3:
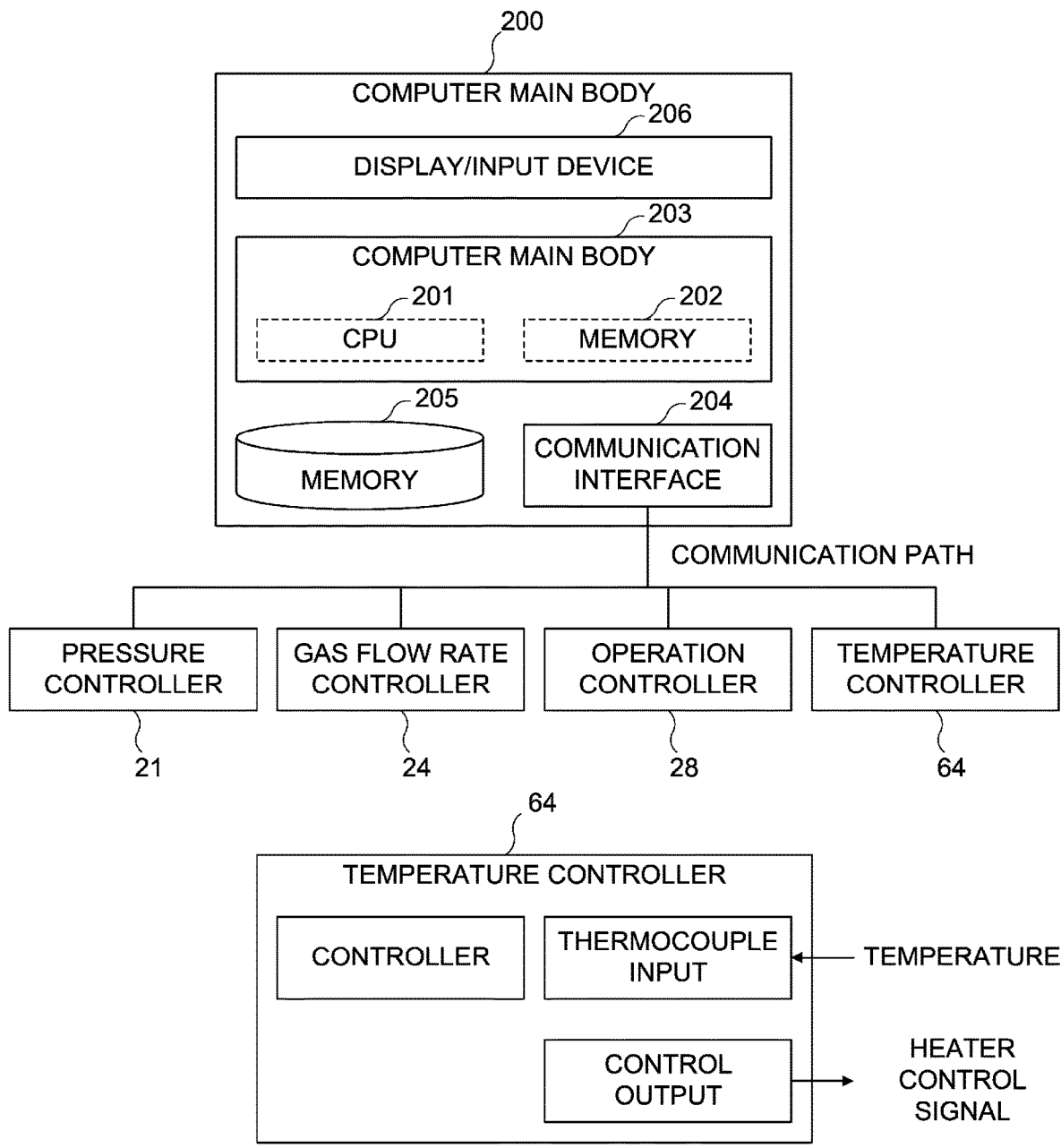
FIG. 3 schematically illustrates a hardware configuration of a controller of the substrate processing apparatus according to the embodiments described herein.

As shown in FIG. 3, a controller 200, which is a control computer serving as a control structure, includes: a computer main body 203 including components such as a CPU (Central Processing Unit) 201 and a memory 202; a communication interface 204 serving as a communication structure; a memory 205 serving as a memory structure; and a display/input device 206 serving as an operation structure. That is, the controller 200 includes components constituting a general-purpose computer.

The CPU 201 constitutes a backbone of the controller 200. The CPU 201 is configured to execute a control program stored in the memory 205 and a recipe (for example, a process recipe) stored in the memory 205, according to an instruction from the display/input device 206. For example, the process recipe includes a temperature control process including a step S1 through a step S9 shown in FIG. 8 described later.

The memory 202 serving as a temporary memory may function as a memory area (work area) of the CPU 201.

The communication interface 204 is electrically connected to the pressure controller 21, the gas flow rate controller 24, the operation controller 28 and a temperature controller 64. The pressure controller 21, the gas flow rate controller 24, the operation controller 28 and the temperature controller 64 may be collectively or individually referred to simply as a sub-controller. The controller 200 can exchange data on operations of components with the sub-controller through the communication interface 204.

Figure 6:
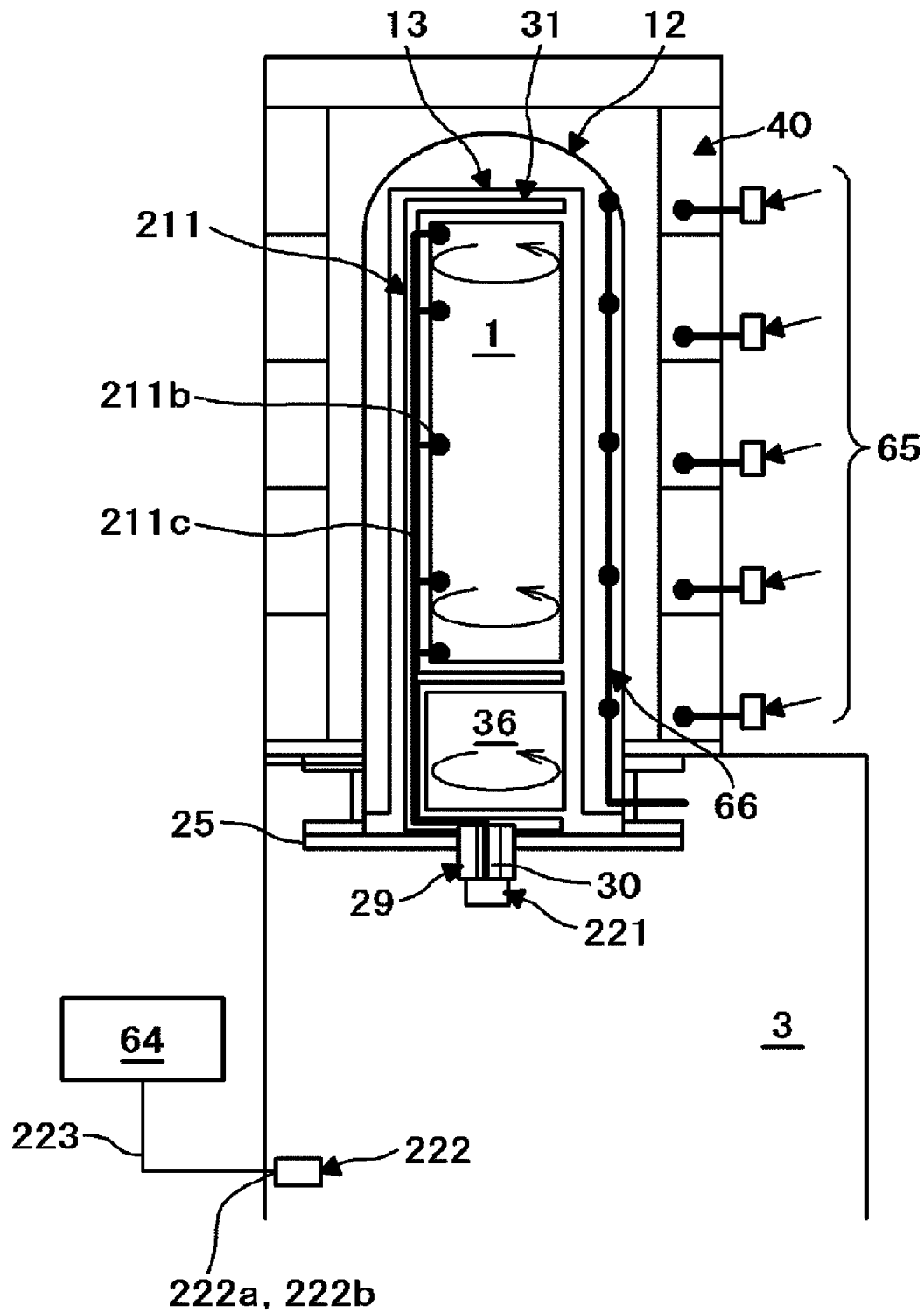
FIG. 6 schematically illustrates the substrate processing apparatus according to the embodiments described herein.

FIG. 6 schematically illustrates the substrate processing apparatus according to the embodiments described herein. In FIG. 6, the substrate to be processed is indicated by "1" and the detailed illustration thereof is omitted.

A configuration of the heater 40 will be described. In the heater 40, a sub-heater is provided for each zone wherein the case 41 is divided into a plurality of zones in a vertical direction (for example, divided into 5 zones as shown in FIG. 6) and a temperature of each zone can be individually controlled. That is, the heater 40 includes a plurality of sub-heaters. A heater thermocouple (which is a first temperature sensor) 65 configured to measure a temperature of the sub-heater is installed for each zone.

A cascade thermocouple (which is a second temperature sensor) 66 configured to measure an inner temperature of a tube such as the outer tube 12 is installed inside the outer tube 12. The cascade thermocouple 66 may be implemented in a structure in which a number of thermocouples corresponding to the number of the zones are accommodated in a quartz tube. Temperature measurement points of thermocouples are disposed at positions facing the zones, respectively.

A substrate temperature meter (which is a third temperature sensor) 211 serving as a substrate temperature sensor is configured to be rotated together with the substrate 1 when the boat 31 and the substrate 1 are rotated. For example, the substrate temperature meter 211 is constituted by a temperature meter 211b configured to measure a temperature of the substrate 1 and a cable 211c including a wire of the temperature meter 211b. The temperature meter 211b and the substrate 1 may not be in contact with each other. However, since the temperature meter 211b is arranged in the process chamber 14, it is preferable to provide a protector (not shown) configured to cover the temperature meter 211b. Further, the cable 211c is pulled out to a lower portion of the boat 31 along one of the support columns 34 of the boat 31. The cable 211c pulled out to the lower portion of the boat 31 is routed and connected to a transmitter 221 under the seal cap 25 through a hole of the rotating shaft 30 provided in a hole formed in the seal cap 25.

The transmitter 221 is fixed to the rotating shaft 30 and configured to make a rotational movement together with the rotating shaft 30. The hole through which the cable 211c passes penetrates the rotating shaft 30. The cable 211c can be pulled out to the transmitter 221 and connected to the transmitter 221 provided outside the process chamber 14 (for example, a lower end of the rotating shaft 30) while vacuum-sealing the hole and its periphery using components such as a hermetic seal.

Figure 4:
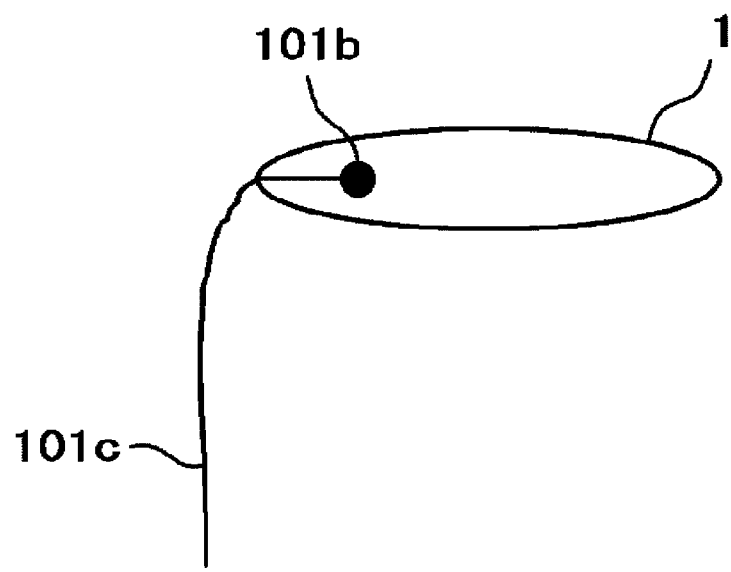
FIG. 4 schematically illustrates an example of a substrate with a thermocouple attached thereto.
Figure 5:
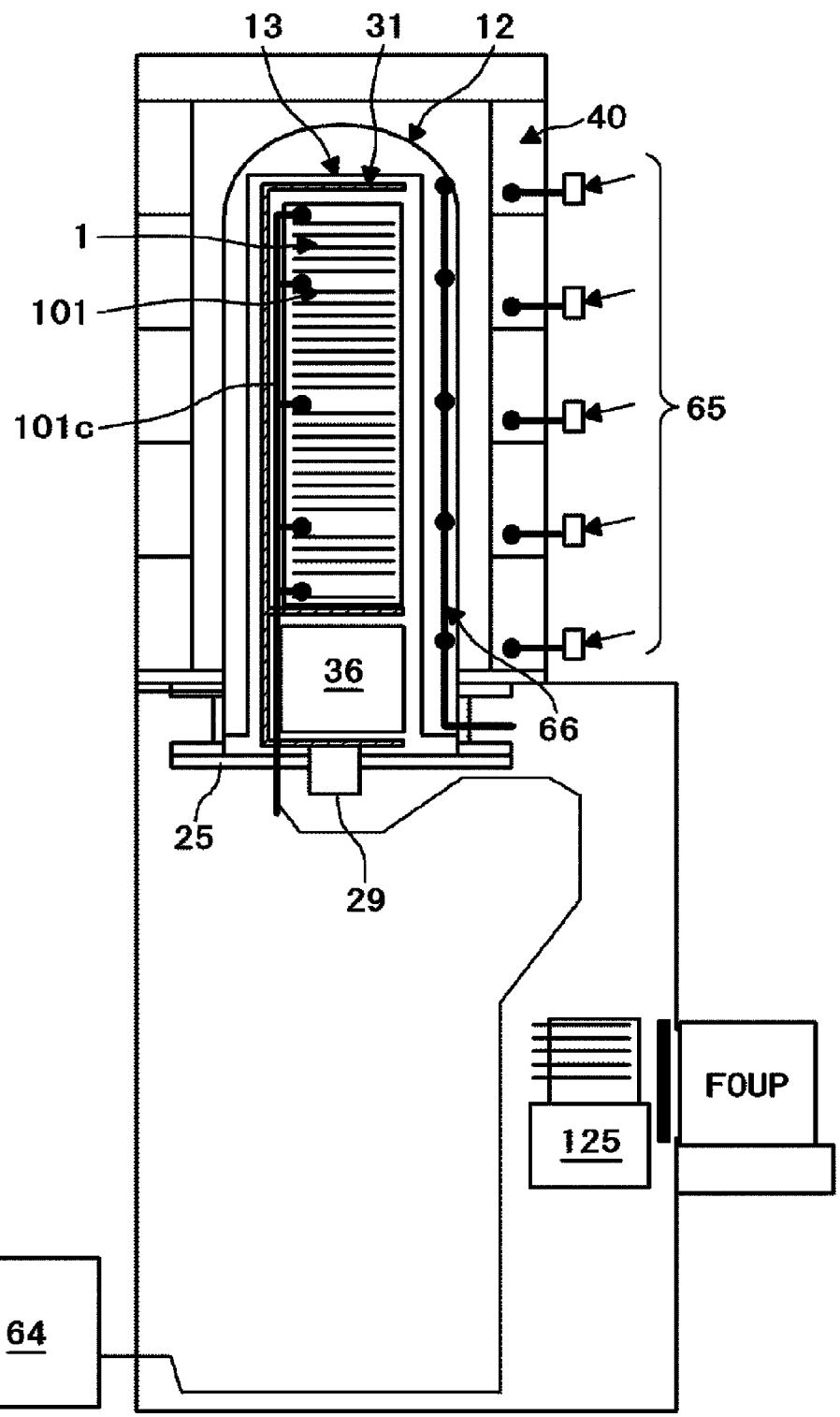
FIG. 5 schematically illustrates an example of routing a cable by using the substrate with the thermocouple when measuring a temperature of a substrate to be measured.

For example, the substrate temperature meter 211 may be a substrate 101 with a thermocouple attached thereto as shown in FIG. 4. The substrate temperature meter 211 can measure the temperature of the substrate 1 by placing the substrate temperature meter 211 (that is, the substrate 101 with the thermocouple shown in FIG. 4) on the boat 31, pulling out the cable 211c (that is, the cable 101c shown in FIG. 4) along the one of the support columns 34 of the boat 31 to the lower portion of the boat 31 and measuring the temperature of the substrate 1 by the temperature meter 211b (that is, a temperature meter 101b shown in FIG. 4).

The substrate temperature meter 211 is not limited to the thermocouple described above. A sensor such as a temperature measuring resistor may be used as long as it can measure the temperature of the substrate 1 as an electric signal. Further, the cable 211c may be arranged inside the one of the support columns 34 of the boat 31 and be pulled out to the lower portion of the boat 31. In such a configuration, the cable 211c is not exposed into the process chamber 14 until it reaches the transmitter 221. Therefore, the cable 211c is prevented from being disconnected (or broken) due to the rotation of the substrate 1 and the boat 31.

Then, the transmitter 221 converts the electric signal (voltage) input from the substrate temperature meter 211 such as the thermocouple via the cable 211c into a digital signal; modulates a radio wave according to the digital signal such that the radio wave carries the digital signal; and transmits the digital signal in the radio wave by using a wireless transmission.

A receiver 222 is provided and fixed in a region below the CAP 25. A terminal (output terminal) 222a configured to receive the digital signal transmitted by the transmitter 221 and to output the received digital signal by a serial communication is provided, or a terminal (output terminal) 222b configured to convert the digital signal into an analog signal and to output the analog signal such as a current ranging from 4 mA to 20 mA is provided. A cable 223 is used to connect the output terminal 222a of the digital signal or the output terminal 222b of the analog signal to a temperature indicator (not shown) or the temperature controller 64, and temperature data is input to the temperature controller 64.

According to the present embodiments, for example, a temperature control system is constituted by the substrate temperature meter 211, the transmitter 221, the receiver 222 and the temperature controller 64. With such a configuration, the wireless transmission is performed between: a rotating portion including the substrate temperature meter 211, the boat 31, the rotating shaft 30 and the transmitter 221; and a fixed portion such as the receiver 222 fixed to the substrate processing apparatus 10. Further, the rotating portion is mechanically separated from the fixed portion such as the receiver 222 while maintaining a temperature data transmission path. Since the rotating portion including the substrate temperature meter 211, the boat 31, the rotating shaft 30 and the transmitter 221 rotates together like an integrated body, and the cable 211c is prevented from being wound around the boat 31.

The signal output from the output terminal 222a or the output terminal 222b of the receiver 222 is input to the temperature controller 64 and displayed as the temperature data by the temperature controller 64. Further, by controlling the temperature of the heater 40 based on the temperature data input to the temperature controller 64, it is possible to more accurately control the temperature of the substrate 1 as compared with a case where the temperature of the substrate 1 is controlled by a conventional cascade thermocouple provided between the outer tube 12 and the inner tube 13.

Figure 7A:
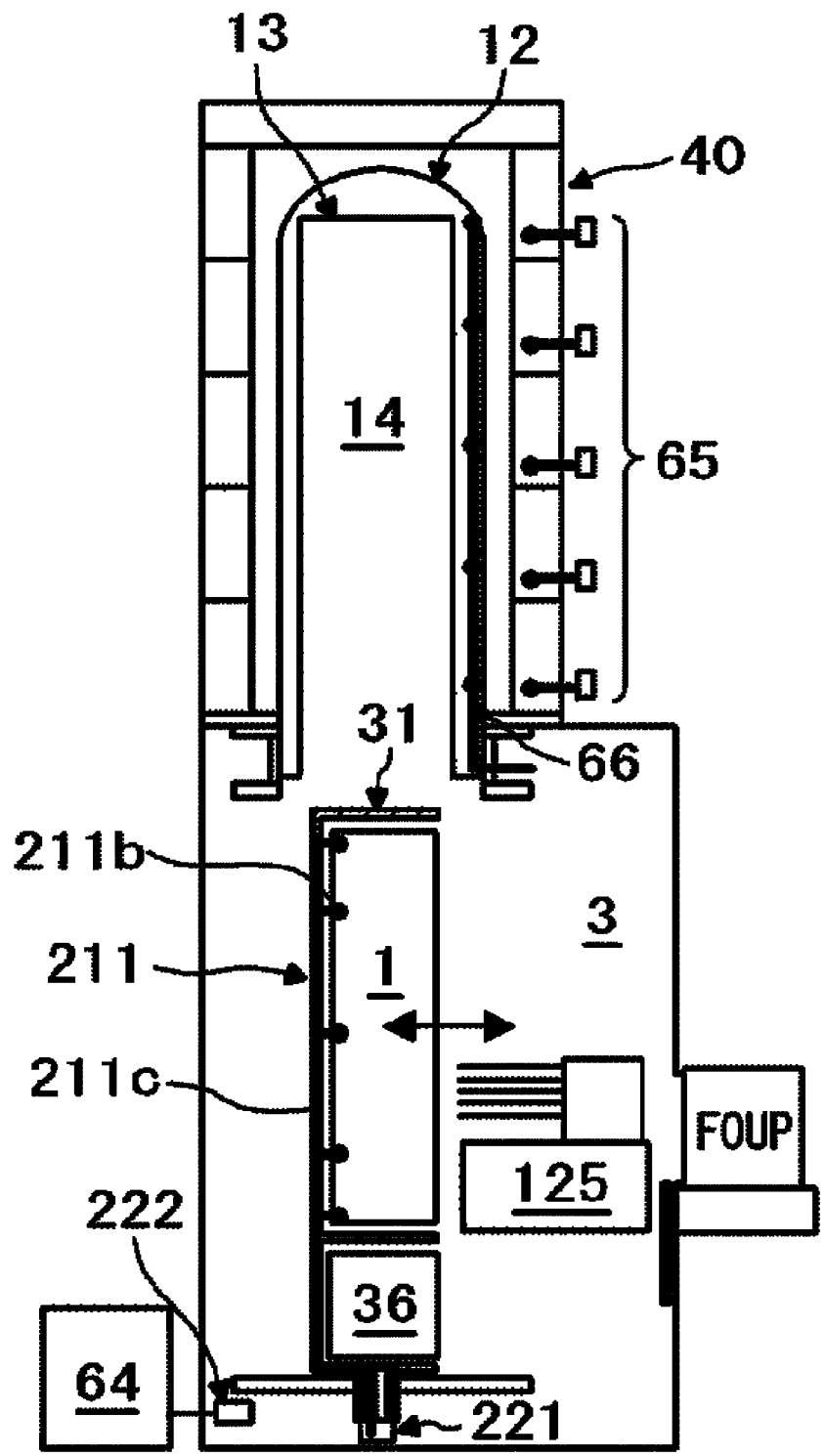
FIGS. 7A through 7C schematically illustrate transition states of the substrate processing apparatus according to the embodiments described herein when a boat of the substrate processing apparatus is loaded, wherein FIG. 7A schematically illustrates the transition state of the substrate processing apparatus when the substrate is being transferred, FIG. 7B schematically illustrates the transition state of the substrate processing apparatus when the boat is being elevated, and FIG. 7C schematically illustrates the transition state of the substrate processing apparatus when loading the boat is complete.
Figure 7B:
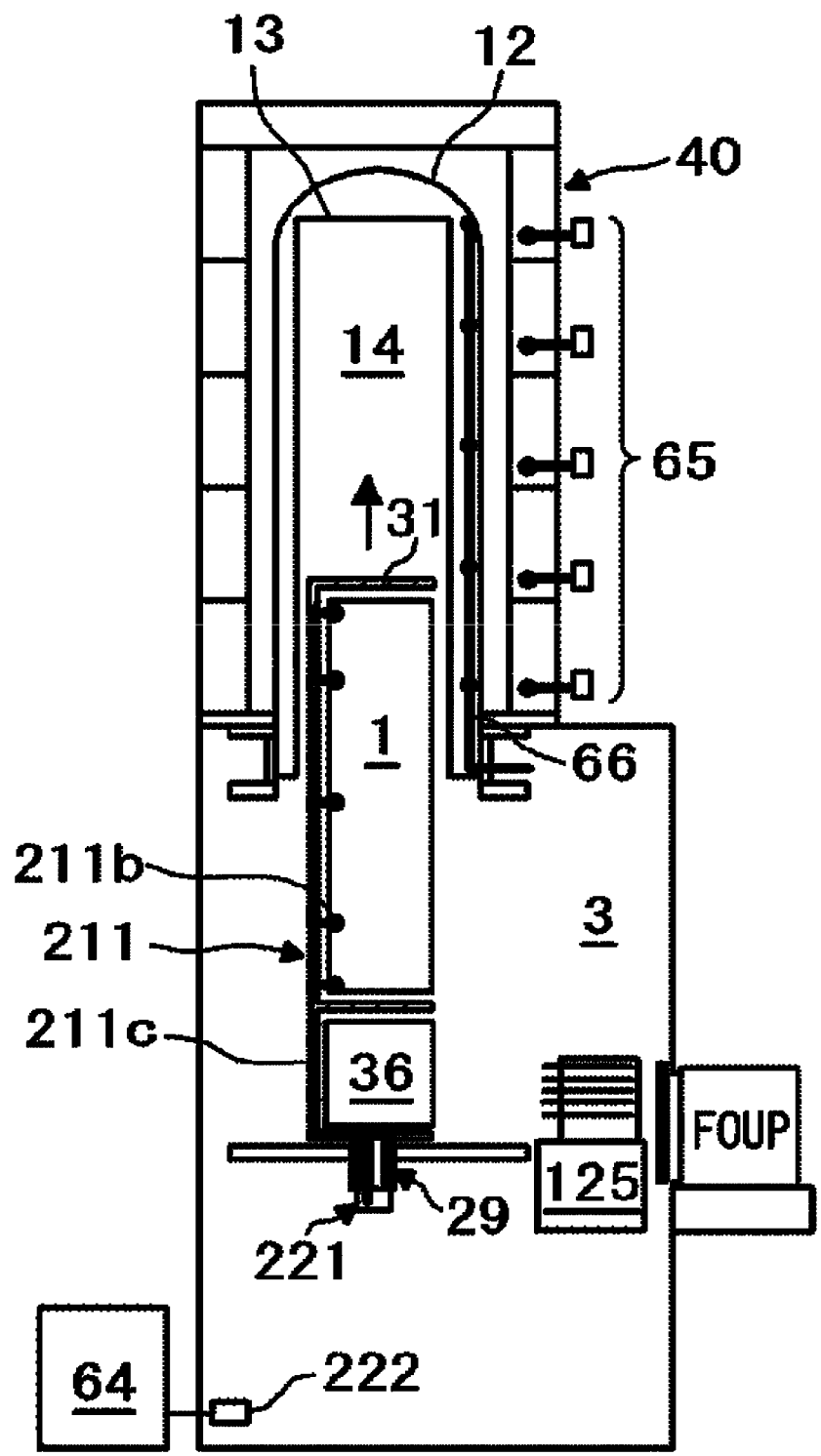
Figure 7C:
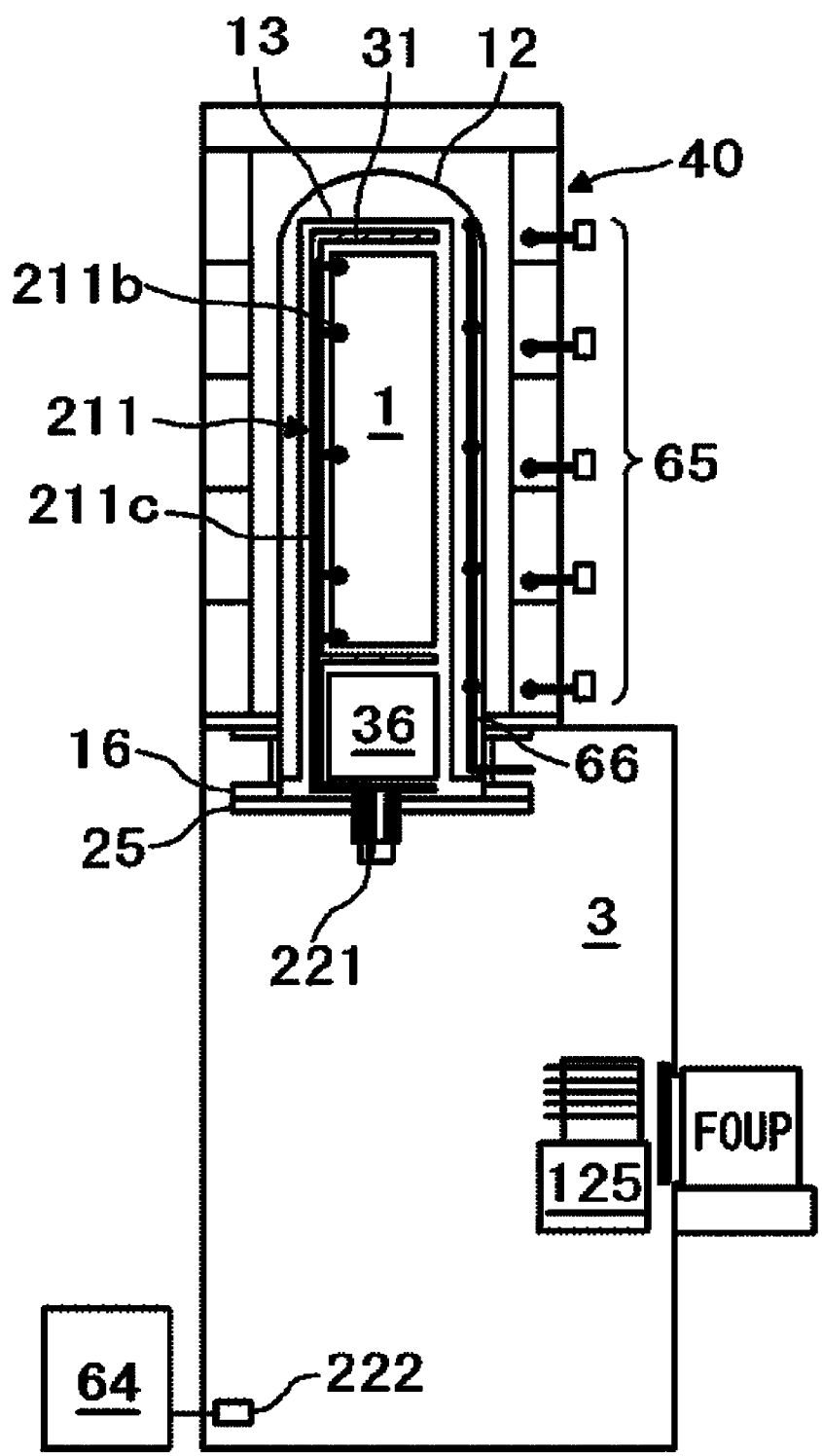

Subsequently, transition states of operations of loading the boat 31 will be described with reference to FIGS. 7A through 7C. FIGS. 7A through 7C schematically illustrate the transition states of the operations of loading the boat 31 (that is, operations of elevating the boat 31) when the plurality of the substrates including the substrate 1 are mounted on the boat 31 and the substrate temperature meter 211 is installed. In FIGS. 7A through 7C, the substrate to be processed is indicated by "1" and the detailed illustration thereof is omitted.

As shown in FIG. 7A, when the plurality of the substrates including the substrate 1 are mounted on the boat 31 by a transfer device 125, the boat 31 is entirely located in the transfer chamber 3, and the transmitter 221 is located in the vicinity of a bottom of the transfer chamber 3. The receiver 222 is fixed to a wall in the vicinity of the bottom of the transfer chamber 3. Then, after the plurality of the substrates including the substrate 1 are completely mounted on the boat 31, as shown in FIG. 7B, the boat 31 and the transmitter 221 are elevated by the boat elevator 26 (see in FIG. 1). The transmitter 221 is elevated from a lower portion of the transfer chamber 3 toward a ceiling of the transfer chamber 3. That is, the transmitter 221 moves away from the receiver 222. Thereafter, the CAP 25 is fixed in contact with the manifold 16, and the boat 31 is stored (accommodated) in the process chamber 14.

Then, the transmitter 221 converts the electric signal (voltage) into a digital signal, modulates the radio wave according to the digital signal such that the radio wave carries the digital signal, and transmits the digital signal in the radio wave by using the wireless transmission to the receiver 222 fixed to the wall in the vicinity of the bottom of the transfer chamber 3. The receiver 222 is connected to the temperature controller 64 provided outside the transfer chamber 3 by the cable 223.

With such a configuration, it is possible to omit a cable used for wiring (or routing) in the transfer chamber 3 (that is, in the region below the CAP 25). By omitting the cable, even though an elevating shaft of the boat 31 is operated, it is possible to eliminate the risk of the cable being disconnected (or broken) due to its cable length being insufficient or the cable being caught somewhere.

According to the present embodiments, by using the wireless transmission for the temperature data transmission path, the rotating portion including the substrate temperature meter 211, the boat 31 (the rotating shaft 30) and the transmitter 221 can be mechanically separated from the fixed portion such as the receiver 222 configured to input the temperature data to the temperature controller 64 while the rotating portion is communicable with the fixed portion through the temperature data transmission path. Therefore, it is possible to measure the temperature of the substrate 1 while rotating the substrate 1 with the substrate temperature meter 211 being provided to serve as the substrate temperature sensor in the vicinity of the substrate 1. Further, by using the wireless transmission for the temperature data transmission path, it is possible to eliminate the risk of the cable being disconnected (or broken) when the elevating shaft of the boat 31 is operated. It is also possible to improve the working efficiency of measuring the temperature of the substrate 1.

According to the present embodiments, by providing the temperature sensor such as the substrate temperature meter 211 in the vicinity of the substrate 1, it is possible to measure the temperature of the substrate 1 in a location close to the substrate 1. As a result, for example, it is possible to remarkably improve the temperature controllability as compared with a conventional temperature control.

Modified Example of Embodiments

Figure 9A:
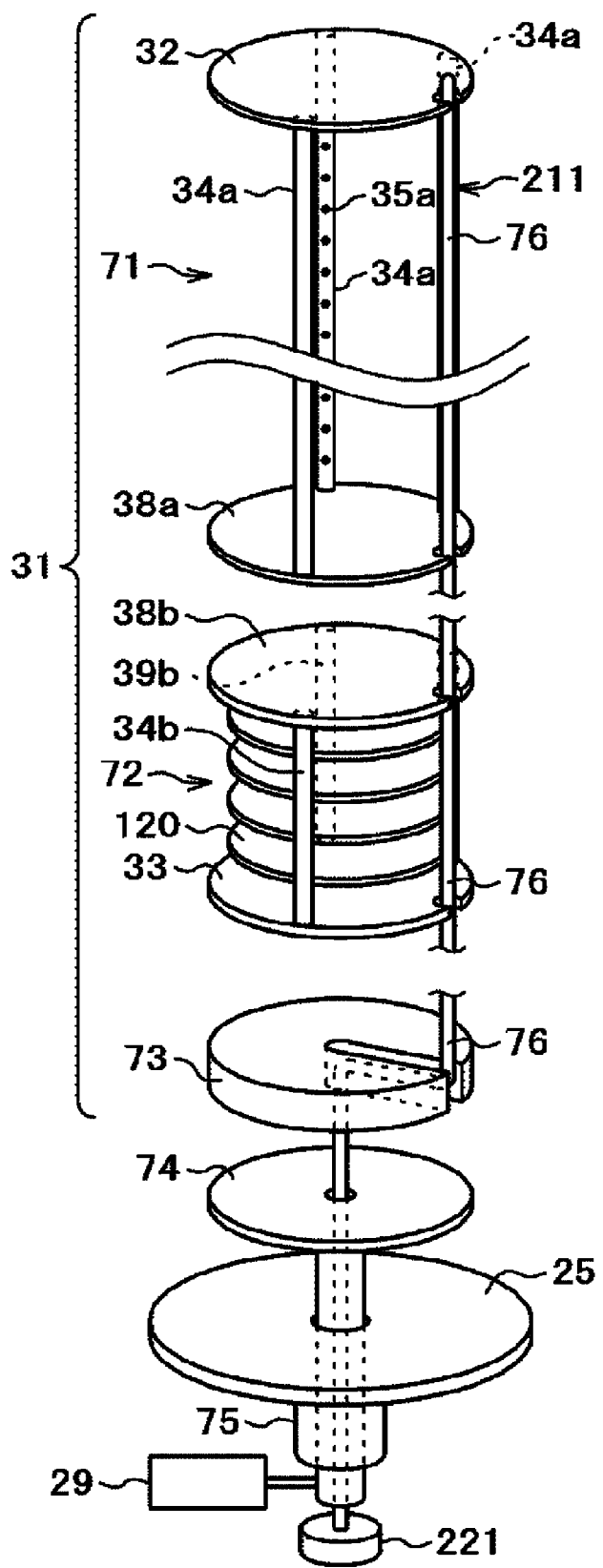
FIG. 9A is an exploded perspective view schematically illustrating a boat according to a modified example of the embodiments described herein, and FIG. 9B schematically illustrates a vertical cross-section of the boat according to the modified example shown in FIG. 9A.
Figure 9B:
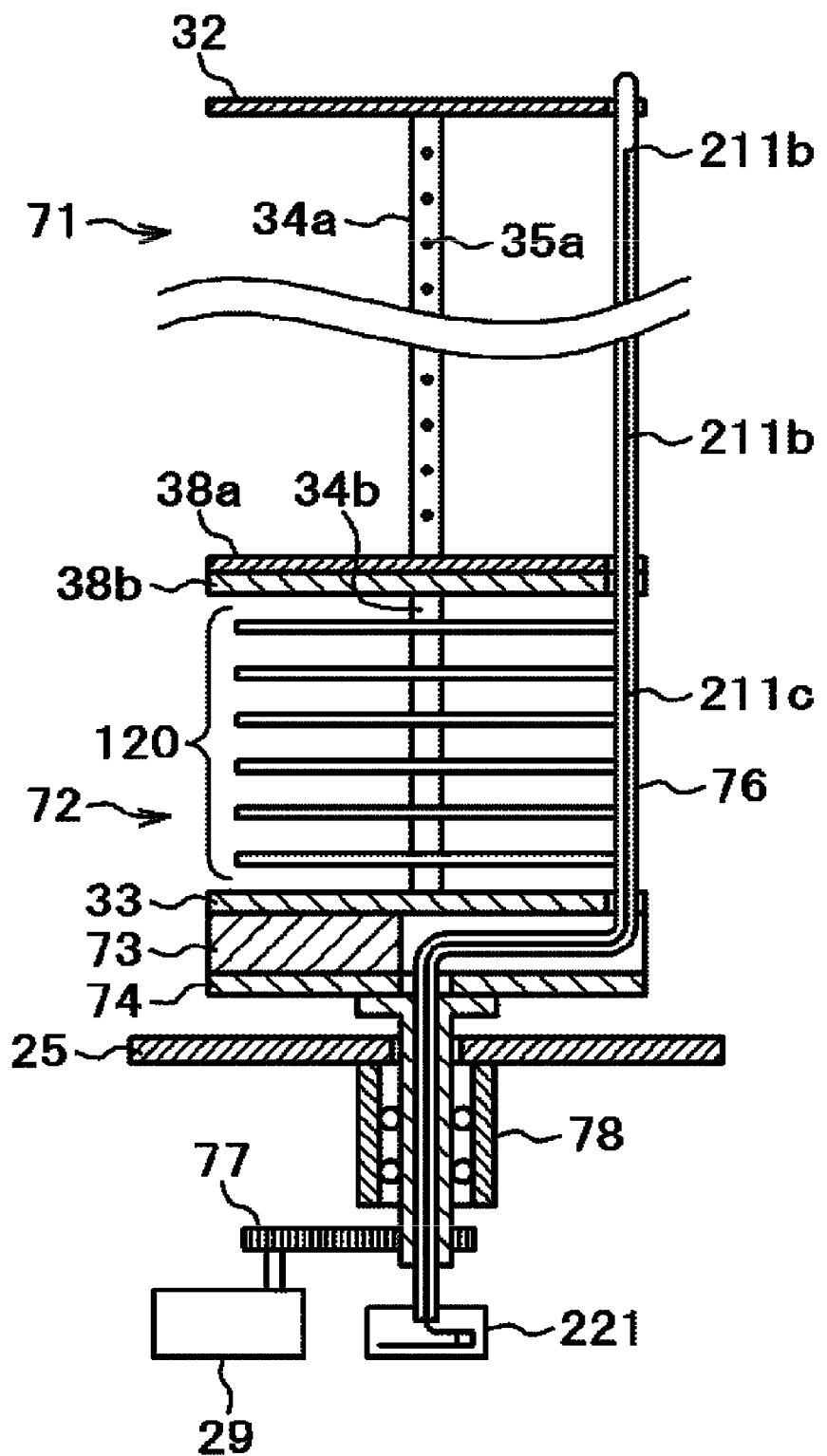

Hereinafter, a boat 31 according to a modified example of the embodiments will be described with reference to FIGS. 9A and 9B. For example, the boat 31 serving as a substrate retainer according to the modified example is constituted by: a substrate holder 71 serving as the substrate processing region; a heat insulating plate holder 72 arranged below the substrate holder 71 and serving as the heat insulating region; and a quartz base 73 serving as a cylinder. The substrate holder 71 may include: an upper end plate 32; a lower end plate 38a; and a plurality of support columns (for example, three support columns) 34a provided between the upper end plate 32 and the lower end plate 38a to connect the upper end plate 32 and the lower end plate 38a. A plurality of support pins 35a are provided at each of the three support columns 34a at equal intervals in a lengthwise direction of each of the three support columns 34a. The support pins 35a provided at the same stage of each of the support columns 34a protrude to face one another. By inserting the plurality of the substrates including the substrate 1 between the support pins 35a provided at the same stage of each of the support columns 34a, the substrate holder 71 supports the plurality of substrates vertically arranged in a multistage manner while the plurality of substrates 1 are horizontally oriented with their centers aligned with one another.

The heat insulating plate holder 72 may include: an upper end plate 38b; a lower end plate 33; and a plurality of support columns (for example, three support columns) 34b provided between the upper end plate 38b and the lower end plate 33 to connect the upper end plate 38b and the lower end plate 33. By inserting the heat insulating plates 120 to a plurality of support recesses 39b located at the same stage of each of the support columns 34b, the heat insulating plate holder 72 supports the heat insulating plates 120 vertically arranged in a multistage manner while the heat insulating plates 120 are horizontally oriented with their centers aligned with one another. That is, the heat insulator 36 is constituted by the heat insulating plate holder 72 and the heat insulating plates 120 accommodated in the heat insulating plate holder 72.

For example, the substrate temperature meter 211 serving as the substrate temperature sensor is constituted by the temperature meter 211b configured to measure the temperature of the substrate 1 and the cable 211c including the wire constituting the temperature meter 211b. For example, the cable 211c is stored (accommodated) in a protective pipe 76 of a crank shape made of quartz.

The CAP 25 airtightly seals (or closes) an inside of a furnace such as the inner tube 13 via the manifold 16 and an O-ring (not shown) by contacting the inner tube 13 when the substrate 1 is processed by the heat (that is, heat-treated). Although not shown, the CAP 25 is attached to an elevating shaft (also referred to as an "E-shaft") capable of elevating and lowering the CAP 25, and the CAP 25 can be elevated and lowered by the elevating shaft. A hole is provided in the center of the CAP 25, and a boat receiver 74 penetrates through the hole. The boat receiver 74 is sealed by a magnetic seal 78, and can be rotated by a rotating shaft (also referred to as an "R-shaft) of the motor 29 while maintaining furnace such as the inner tube 13 in a vacuum state.

The protective pipe 76 configured to accommodate the substrate temperature meter 211 may extend below the CAP 25 through a hole opened in a center of the boat receiver 74. The protective pipe 76 that extends below the CAP 25 is fixed to the boat receiver 74 by a vacuum sealable fixing method (for example, by using Ultra-Torr®).

The quartz base 73, which is located at a lower end of the boat 31, is installed on the boat receiver 74. The quartz base 73 is provided with a notch of a U shape. The protective pipe 76 protruding into the furnace from the center of the boat receiver 74 extends laterally along the notch of the quartz base 73 as its guide, and extends upward again from an outer circumference of the heat insulating plate holder 72. The heat insulating plate holder 72 capable of holding the heat insulating plates 120 is installed on the quartz base 73. Further, a thickness of the quartz base 73 is greater than an outer diameter of the protective pipe 76 so that no load is applied to the protective pipe 76.

Each of the upper end plate 38b which is a top plate of the heat insulating plate holder 72 and the lower end plate 33 which is a bottom plate of the heat insulating plate holder 72 is provided with a notch through which the protective pipe 76 extending upward passes. In order to install the protective pipe 76 in the vicinity of the substrate 1, each of the upper end plate 32 which is a top plate of the substrate holder 71 of the boat 31 and the lower end plate 38a which is a bottom plate of the substrate holder 71 of the boat 31 is provided with a notch as well. Therefore, it is possible to provide the temperature meter 211b (which is a temperature measuring point of the substrate temperature meter 211) in the vicinity of the substrate 1. As a result, it is possible to measure the temperature at a location closer to the substrate 1 as compared with a case where a conventional cascade TC is installed in the vicinity of a wall of the reaction tube (that is, the process tube 11). The protective pipe 76 is provided in the vicinity of the support columns 34a and the support columns 34b.

The boat 31 constituted by the substrate holder 71, the heat insulating plate holder 72 and the quartz base 73 and the substrate temperature meter 211 are configured to be mounted on the boat receiver 74. By rotating the boat receiver 74 by the R-shaft of the motor 29 via a drive belt 77, the boat 31 and the substrate temperature meter 211 are rotated together. The CAP 25 and the magnetic seal 78 are not rotated.

By connecting the cable 211c pulled out to a bottom of the CAP 25 to the transmitter 221 rotated together with the boat receiver 74, it is possible to measure the temperature of the substrate 1 while rotating the substrate 1.

While the modified example is described by way of an example in which the substrate temperature meter 211 is provided in the protective pipe 76, the modified example is not limited thereto. For example, the substrate temperature meter 211 may be provided in one of the support columns 34a or one of the support columns 34b. Further, the wire of the temperature meter 211b such as the thermocouple may be arranged inside the one of the support columns 34a or the one of the support columns 34b without providing the protective pipe 76.

Exemplary Sequence of Substrate Processing

Figure 8:
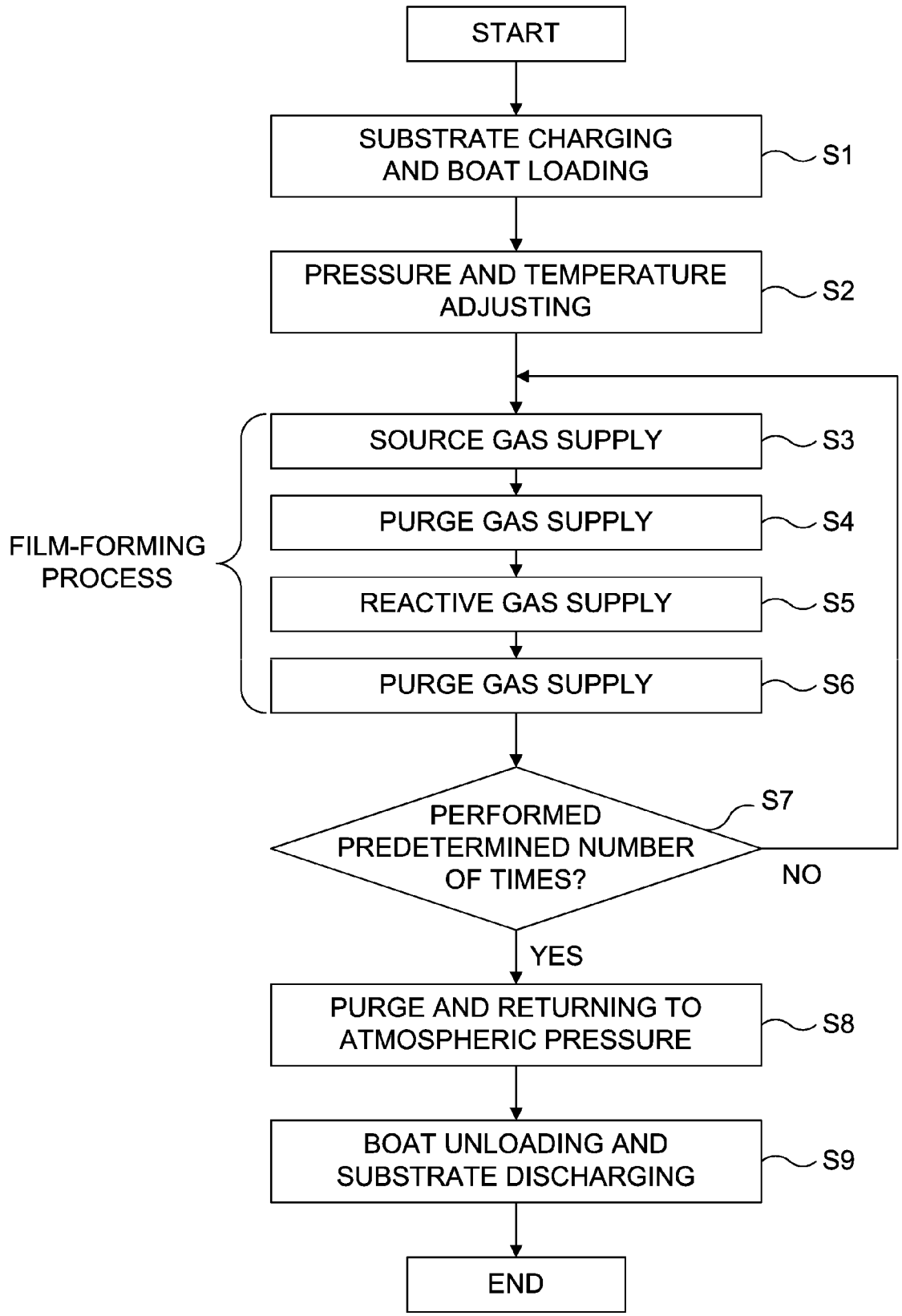
FIG. 8 is a flowchart schematically illustrating a substrate processing according to the embodiments described herein.

Subsequently, an exemplary sequence of a process of forming a film on a substrate (hereinafter, also referred to as a "substrate processing" or a "film-forming process"), which is a part of manufacturing processes of a semiconductor device, using the substrate processing apparatus 10 will be described with reference to FIG. 8.

Hereinafter, an example of forming a silicon nitride film ($Si_3N_4$ film, hereinafter simply referred to as an "SiN film") on the substrate 1 by using hexachlorodisilane ($Si_2Cl_6$, abbreviated as HCDS) gas serving as a source gas and ammonia ($NH_3$) gas serving as a reactive gas will be described. Hereinafter, the controller 200 and the sub-controller control the operations of the components constituting the substrate processing apparatus 10.

In the film-forming process according to the present embodiments, the SiN film is formed on the substrate 1 by performing a cycle a predetermined number of times (once or more). The cycle may include: a step of supplying the HCDS gas onto the substrate 1 in the process chamber 14; a step of removing the HCDS gas (residual gas) from the process chamber 14; a step of supplying the $NH_3$ gas onto the substrate 1 in the process chamber 14; and a step of removing the $NH_3$ gas (residual gas) from the process chamber 14. The steps in the cycle are performed non-simultaneously.

Substrate Charging and Boat Loading: Step S1

The operation controller 28 controls the transfer device 125 and the transfer device elevator (not shown) to transfer the plurality of substrates including the substrate 1 in the substrate processing region of the boat 31 (substrate charging step). The heat insulating plates 120 are accommodate in the heat insulating plate region of the boat 31 in advance.

Then, the operation controller 28 controls the boat elevator 26 to load the boat 31 accommodating the plurality of substrates including the substrate 1 and the heat insulating plates 120 into the process tube 11, and then to load into the process chamber 14 (boat loading). When the boat 31 is loaded into the process chamber 14, the CAP 25 airtightly seals (or closes) the lower end of the inner tube 13 via the O-ring (not shown).

Pressure and Temperature Adjusting: Step S2

The pressure controller 21 controls the exhauster 19 such that the inner pressure of the process chamber 14 reaches a predetermined pressure (vacuum level). When the pressure controller 21 controls the exhauster 19, an inner pressure of the process chamber 14 is measured by the pressure sensor 20, and the exhauster 19 is feedback-controlled based on pressure information measured by the pressure sensor 20. The exhauster 19 is continuously operated at least until the processing of the substrate 1 is completed.

The heater 40 heats the process chamber 14 until the temperature of the substrate 1 inside the process chamber 14 reaches and is maintained at a predetermined temperature. When heater 40 heats the process chamber 14, the temperature controller 64 feedback-controls a state of electric conduction of the heater 40 based on temperature information detected by the substrate temperature meter 211 such that a predetermined temperature distribution of the inner temperature of the process chamber 14 can be obtained. The heater 40 continuously heats the process chamber 14 at least until the processing of the substrate 1 is completed. Further, the temperature information detected by the heater thermocouple 65 and the cascade thermocouple 66 may be used when the temperature controller 64 feedback-controls the state of electric conduction of the heater 40.

The boat 31 and the substrate 1 are rotated by the motor 29. Specifically, the operation controller 28 rotates the motor 29 to rotate the boat 31 and the transmitter 221. The substrate 1 is thereby rotated. The motor 29 continuously rotates the boat 31, the transmitter 221 and the substrate 1 at least until the processing of the substrate 1 is completed.

Film-Forming Process

When the inner temperature of the process chamber 14 is stabilized at a pre-set process temperature, four steps described below, that is, a step S3 through a step S6, are sequentially performed.

Source Gas Supply: Step S3

In the step S3, the HCDS gas is supplied onto the substrate 1 in the process chamber 14.

In the step S3, the HCDS gas is supplied to the process chamber 14 through the gas introduction pipe 22. Specifically, the HCDS gas whose flow rate is adjusted by the gas flow rate controller 24 is supplied to the process chamber 14 of the inner tube 13, and is exhausted through the exhaust path 17 and the exhaust pipe 18. Simultaneously, $N_2$ gas is supplied through the gas introduction pipe 22. The $N_2$ gas whose flow rate is adjusted by the gas flow rate controller 24 is supplied to the process chamber 14 with the HCDS gas, and is exhausted through the exhaust pipe 18. By supplying the HCDS gas onto the substrate 1, for example, a silicon (Si)-containing layer whose thickness is within a range from less than one atomic layer to several atomic layers is formed as a first layer on a top surface of the substrate 1.

Purge Gas Supply: Step S4

After the first layer is formed on the substrate 1, the supply of the HCDS gas is stopped. In the step S4, the exhauster 19 vacuum-exhausts the process chamber 14 to remove a residual HCDS gas which did not react or which did contribute to the formation of the first layer in the process chamber 14 from the process chamber 14. The $N_2$ gas is continuously supplied into the process chamber 14. The $N_2$ gas acts as a purge gas, which improves the efficiency of removing the residual HCDS gas from the process chamber 14.

Reactive Gas Supply: Step S5

After the step S4 is completed, the $NH_3$ gas is supplied onto the substrate 1 in the process chamber 14 (that is, onto the first layer formed on the substrate 1 in the process chamber 14. In the step S5, the $NH_3$ gas is thermally activated and then supplied onto the substrate 1.

In the step S5, the $NH_3$ gas is supplied to the process chamber 14 through the gas introduction pipe 22. Specifically, the $NH_3$ gas whose flow rate is adjusted by the gas flow rate controller 24 is supplied to the process chamber 14 of the inner tube 13, and is exhausted through the exhaust path 17 and the exhaust pipe 18. Simultaneously, the $N_2$ gas is supplied through the gas introduction pipe 22. The $N_2$ gas whose flow rate is adjusted by the gas flow rate controller 24 is supplied to the process chamber 14 with the $NH_3$ gas, and is exhausted through the exhaust pipe 18. Thereby, the $NH_3$ gas is supplied onto the substrate 1. The $NH_3$ gas supplied onto the substrate 1 reacts with the first layer (that is, at least a portion of the silicon-containing layer formed on the substrate 1 in the first step S3). As a result, the first layer is thermally nitrided under a non-plasma atmosphere and changed (modified) into a second layer, that is, a silicon nitride (SiN) layer.

Purge Gas Supply: Step S6

After the second layer is formed, the supply of the $NH_3$ gas is stopped. The exhauster 19 vacuum-exhausts the process chamber 14 to remove a residual $NH_3$ gas which did not react or which did contribute to the formation of the second layer in the process chamber 14 from the process chamber 14 in the same manner as the step S4. Similar to the step S4, the gas remaining in the process chamber 14 may not be completely discharged.

Performing a Predetermined Number of Times: Step S7

The cycle in which the four steps described above are performed non-simultaneously are performed a predetermined number of times (n times) until a silicon nitride (SiN) film of a predetermined thickness is formed on the substrate 1. It is preferable that the cycle is repeatedly performed until the SiN film of the predetermined thickness is obtained by controlling the second (SiN) layer formed in each cycle to be thinner than the SiN film of the predetermined thickness and stacking the thin second (SiN) layer by repeatedly performing the cycle. That is, it is preferable that the cycle is performed a plurality of times.

Purge and Returning to Atmospheric Pressure: Step S8

After the film-forming process is completed, the $N_2$ gas is supplied into the process chamber 14 through the gas introduction pipe 22, and is exhausted through the exhaust pipe 18. The $N_2$ gas serves as a purge gas. Thus, the inside of the process chamber 14 is purged, and substances such as the residual gas in the process chamber 14 and the reaction by-products are removed from the process chamber 14 (purge). Simultaneously, in order to efficiently lower the inner temperature of the process chamber 14 from the process temperature, the cooling air 90 serving as the cooling gas is supplied to the gas introduction path 107 via the check damper 104. The supplied cooling air 90 is temporarily stored in the buffer 106 and is ejected into the space 75 through the opening hole 110 provided in each zone and the gas supply flow path 108 to cool the process tube 11. When cooling the process tube 11, the temperature controller 64 may control the cooling of the process chamber 14 by the cooling air 90 according to the temperature information detected by the substrate temperature meter 211, or the temperature controller 64 may determine whether to stop the cooling of the process chamber 14. Then, an inner atmosphere of the process chamber 14 is replaced with an inert gas (substitution by the inert gas) and the inner pressure of the process chamber 14 is returned to a normal pressure (returning to the atmospheric pressure). In the step S8, the temperature controller 64 may determine whether to perform the next boat unloading step based on the temperature information detected by the substrate temperature meter 211.

Boat Unloading and Substrate Discharging: Step S9

Thereafter, by lowering the boat elevator 26 by the operation controller 28, the CAP 25 is lowered by the boat elevator 26, and the lower end of the process tube 11 is opened. The boat 31 with the processed substrates including the substrate 1 charged therein is unloaded out of the process tube 11 through the lower end of the process tube 11 (boat unloading step). Then, the processed substrates including the substrate 1 are discharged from the boat 31 (substrate discharging step).

Other Embodiments

While the technique is described in detail by way of the embodiments and the modified example, the above-described technique is not limited thereto. The above-described technique may be modified in various ways without departing from the gist thereof.

For example, the above-described embodiments are described by way of an example in which the SiN film is formed. However, the above-described technique is not limited thereto. For example, the above-described technique may also be applied to form various types of films such as an oxide film. For example, the oxide film includes a silicon oxide (SiO) film or a metal oxide film.

For example, the above-described embodiments are described based on the substrate processing apparatus. However, the above-described technique is not limited thereto. For example, the above-described technique may be generally applied to a semiconductor manufacturing apparatus. For example, the above-described technique may also be applied to a substrate processing apparatus such as an LCD (Liquid Crystal Display) manufacturing apparatus configured to process a glass substrate.

According to some embodiments in the present disclosure, it is possible to provide the temperature sensor in the vicinity of the substrate and measuring the temperature of the substrate which is being rotated.

What is claimed is:

1. A substrate temperature sensor configured to measure a temperature of a substrate,
   wherein the substrate temperature sensor is provided in a protective pipe passing through a notch provided at least in a bottom plate of a substrate retainer inserted into a process chamber in a state where the substrate is mounted on the substrate retainer.

2. The substrate temperature sensor of claim 1, wherein the substrate temperature sensor is capable of being rotated together with the substrate when the substrate retainer is being rotated.

3. The substrate temperature sensor of claim 1, comprising
   a cable provided along a support column of the substrate retainer.

4. The substrate temperature sensor of claim 1, comprising
   a cable inserted in a support column of the substrate retainer.

5. A substrate retainer configured to be inserted into a process chamber in a state where a substrate is mounted on the substrate retainer, comprising
   a protective pipe passing through a notch provided at least in a bottom plate of the substrate retainer and capable of accommodating a substrate temperature sensor configured to measure a temperature of the substrate.

6. The substrate retainer of claim 5, wherein the substrate temperature sensor comprises:
   a temperature meter configured to measure the temperature of the substrate; and
   a cable comprising a wire constituting the temperature meter.

7. The substrate retainer of claim 5, wherein the protective pipe is installed in vicinity of a support column of the substrate retainer.

8. The substrate retainer of claim 5, wherein the protective pipe is of a crank shape.

9. The substrate retainer of claim 5, further comprising:
   a substrate holder comprising a substrate processing region in which the substrate is accommodated;
   a heat insulating plate holder comprising a heat insulating region in which a heat insulating plate is accommodated; and
   a base provided with a notch at a lower end thereof,
   wherein the protective pipe extends laterally along the notch as a guide thereof, and extends upward from an outer circumference of the heat insulating plate holder.

10. The substrate retainer of claim 9, wherein a thickness of the base is greater than an outer diameter of the protective pipe.

11. A substrate processing apparatus comprising:
    a process chamber in which a substrate is accommodated;
    a substrate temperature sensor configured to measure a temperature of the substrate;
    a protective pipe configured to accommodate the substrate temperature sensor; and
    a substrate retainer in which the protective pipe passes through a notch provided at least in a bottom plate thereof.

12. The substrate processing apparatus of claim 11, further comprising
    a rotator configured to rotate the substrate retainer, and
    wherein the substrate temperature sensor is capable of being rotated together with the substrate retainer while the substrate retainer is being rotated by the rotator.

13. The substrate processing apparatus of claim 11, further comprising
    a transmitter provided under the rotator, capable of being rotated together with the substrate while the substrate retainer is being rotated by the rotator, and connected to the substrate temperature sensor at a location outside the process chamber.

14. The substrate processing apparatus of claim 13, further comprising:
    a receiver configured to receive a signal output from the transmitter; and
    a controller connected to the receiver,
    wherein the transmitter is configured to convert an input signal into a digital signal and to wirelessly transmit the digital signal in a radio wave to the receiver by modulating the radio wave according to the digital signal.

15. The substrate processing apparatus of claim 14, wherein the receiver is configured to receive the digital signal output from the transmitter, to convert the digital signal into an analog signal and to output the analog signal to the controller.

16. The substrate processing apparatus of claim 14, further comprising
    a transfer chamber provided adjacent to the process chamber,
    wherein the receiver is provided at an inner wall of the transfer chamber distanced apart from the transmitter provided at a boundary between the process chamber and the transfer chamber.

* * * * *